United States Patent
Wang et al.

(10) Patent No.: US 10,461,275 B2
(45) Date of Patent: Oct. 29, 2019

(54) FLEXIBLE DISPLAY COMPONENT AND DISPLAY SCREEN

(71) Applicant: Wuhan China Star Optoelectronics Semiconductor Display Technology Co., Ltd., Wuhan, Hubei (CN)

(72) Inventors: Szu Yuan Wang, Guangdong (CN); Lei Hu, Guangdong (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 15/737,293

(22) PCT Filed: Oct. 20, 2017

(86) PCT No.: PCT/CN2017/106979
§ 371 (c)(1),
(2) Date: Dec. 17, 2017

(87) PCT Pub. No.: WO2019/019436
PCT Pub. Date: Jan. 31, 2019

(65) Prior Publication Data
US 2019/0036070 A1    Jan. 31, 2019

(51) Int. Cl.
| H01L 29/08 | (2006.01) |
| H01L 51/52 | (2006.01) |
| H01L 51/00 | (2006.01) |
| B32B 7/08  | (2019.01) |
| B32B 3/26  | (2006.01) |
| B32B 5/18  | (2006.01) |

(52) U.S. Cl.
CPC .......... *H01L 51/5246* (2013.01); *B32B 3/266* (2013.01); *B32B 5/18* (2013.01); *B32B 7/08* (2013.01); *H01L 51/0097* (2013.01); *H01L 51/529* (2013.01); *H01L 51/5253* (2013.01); *B32B 2457/206* (2013.01); *H01L 2251/5338* (2013.01)

(58) Field of Classification Search
CPC .................................................. H01L 51/5246
USPC ........................................................... 257/40
See application file for complete search history.

(56) References Cited

U.S. PATENT DOCUMENTS

| 9,439,315 B2 | 9/2016 | Lee et al. |
| 9,444,061 B2 | 9/2016 | Shi et al. |

(Continued)

FOREIGN PATENT DOCUMENTS

| CN | 104037337 A | 9/2014 |
| CN | 104319263 A | 1/2015 |

(Continued)

*Primary Examiner* — Ajay Arora
(74) *Attorney, Agent, or Firm* — Andrew C. Cheng

(57) ABSTRACT

A flexible display component and a display screen are provided. The flexible display component includes a display module; a buffering layer; and at least two fixing parts disposed at the display module for fixing the buffering layer to be movably fixed to a side of the display module, wherein, when the display module is under a natural status, the buffering layer is contacted with the display module, when the display module is under a bending status, a gap layer is existed between the buffering layer and the display module. Through above way, the present invention can improve the bending reliability of the display module.

15 Claims, 3 Drawing Sheets

(56) References Cited

U.S. PATENT DOCUMENTS

| | | | | |
|---|---|---|---|---|
| 2011/0273906 A1* | 11/2011 | Nichol | ............... | G02B 6/0076 |
| | | | | 362/607 |
| 2014/0002973 A1* | 1/2014 | Lee | ...................... | H05K 7/00 |
| | | | | 361/679.01 |
| 2016/0116831 A1* | 4/2016 | Haga | ................... | H04N 9/317 |
| | | | | 353/69 |

FOREIGN PATENT DOCUMENTS

| | | | |
|---|---|---|---|
| CN | 106023825 A | * | 10/2016 |
| CN | 106023825 A | | 10/2016 |
| CN | 107221256 A | | 9/2017 |

\* cited by examiner

FLEXIBLE DISPLAY COMPONENT AND DISPLAY SCREEN

BACKGROUND OF THE INVENTION

1. Field of the Invention

The present invention relates to a display panel field, and more particularly to a flexible display component and display screen.

2. Description of Related Art

Along with the development of the OLED display technology, a huge number of consumers experience the great difference between OLED display and conventional LCD display, and following with a rapid growth of the OLED consumer market. Because the OLED has a self-emitting character, the characters of short response time, high contrast, wide viewing angle, wide color gamut, thin display panel, being bendable can be realized. Especially, the bendable character of the display panel bring a subversive concept to the consumer so that the flexible OLED has become a mainstream of the development of the OLED technology.

With reference to FIG. 1, in the conventional art, a flexible display component is formed by adhering a flexible display module 11 and a buffering portion 12 through a bonding material 13. Because the flexible display module 11 has certain of brittleness, especially, a neutral plane of the flexible display module 11 has a larger brittleness; the neutral plane is easily to generate fracture when bending. Using the bonding material to directly fix the buffering portion 12 to the flexible display module 11 will limit a deformation space of the buffering portion 12 such that when bending the buffering portion 12, a sudden change of stress is easily to generate. Besides, the existing of the buffering portion 12 and the bonding material 13 will make an entire thickness of the flexible display module 11 to be increased so that a location of the neutral plane of the flexible display module 11 is changed so as to increase a surface stress of the neutral plane. Accordingly, a risk of cracking inside the module is increased when bending.

SUMMARY OF THE INVENTION

The main technology problem solved by the present invention is to provide a flexible display component and a display screen, which can solve the cracking problem of the display module under the bending status of the conventional art.

In order to solve the above technology problem, the embodiment of the present invention provides a flexible display component, comprising: a display module; a buffering layer; and at least two fixing parts disposed at the display module for fixing the buffering layer to be movably fixed to a side of the display module, wherein, when the display module is under a natural status, the buffering layer is contacted with the display module, when the display module is under a bending status, a gap layer is existed between the buffering layer and the display module.

The embodiment of the present invention also provides a display screen comprising the flexible display component of the embodiment of the above invention.

Comparing to the conventional art, the beneficial effect of the present invention is: through disposing the fixing part, when the display module is under a bending status, a gap layer is existed between the buffering layer and the display module 21. The gap layer can effectively release the stress in the bending process of the display module. The change of the generated stress will not direct transmit to the display module, which reduces the stress acted on the display module in order to protect the display module from being damaged so as to improve the bending reliability of the display module.

DETAILED DESCRIPTION OF THE PREFERRED EMBODIMENT

Figure 1:
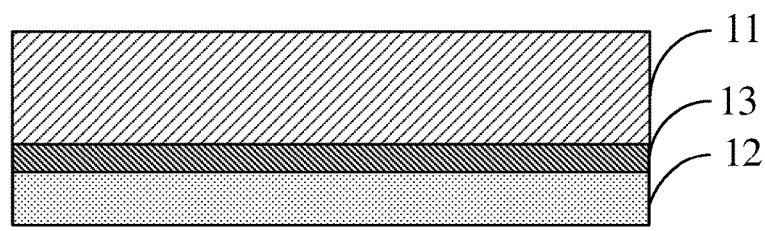
FIG. 1 is a schematic diagram of a flexible display component of the conventional art.

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

With reference to FIG. 2 to FIG. 6, an embodiment of the flexible display component of the present invention includes a display module 21, a buffering layer 22 and at least two fixing parts 23.

Wherein, the flexible display component in the present embodiment is a flexible OLED screen. Generally, the display module 21 at least includes an inorganic layer 211, at least two organic layers 212, 213. The inorganic layer 211 is clamped between the organic layers 212, 213. A side of the display module 21 is a bottom of a display portion of the display module 21. For example, the organic layer 213 at that side functions as a base of the display module 21. The other side of the display module 21 is corresponding to a display portion. That is, the organic layer 212 at the other side of the module is corresponding to the display portion. For example, the organic layer 212 is provided with an organic light-emitting material. The inorganic layer 211 disposed between the two organic layers 212, 213 has a function to block water and oxygen.

The buffering layer 22 mainly has functions to protect the display module 21 and heat dissipating. For example, the buffering layer 22 is a foam layer. At least two fixing parts 23 disposed on the display module 21 for fixing the buffering layer 22 at a side of the display module 21. For example, being movably fixed. A space is reserved between the buffering layer 22 and the display module 21 for fixing movably such that the buffering layer 22 and the display module 21 are not fixed tightly. Wherein, when the display module 21 is under a natural status, that is, under a non-bending status, the buffering layer 22 is contacted with a side of the display module 21 so that the buffering layer 22 can provide a buffer protection and a heat dissipating function for the display module 21. When the display module 21 is under a bending status, a gap layer 24 is existed between the buffering layer 22 and the display module 21 so as to reduce the stress acted on the display module 21 in order to protect the display module 21 from being damaged. Furthermore, because a brittleness of the inorganic layer 211 in the display module 21 is larger such that in the bending process of the display module 21, a cracking status of the inorganic layer 211 is generated, especially, in the conventional art.

With reference to FIG. 1, using a bonding material to directly fix the buffering layer 12 and the display module 11 will generate a sudden change of stress when bending. Besides, the existing of the buffering layer 12 and the bonding layer 13 changes the location of the neutral plane of the inorganic layer in the display module 12 such that a surface stress on the inorganic layer is increased so as to increase the risk of cracking of the inorganic layer. Therefore, the present embodiment is provided with a fixing part 23. When the display module 21 is under a bending status, a gap layer 24 is existed between the buffering layer 22 and the display module 21, which is different from the conventional art that adopting a bonding material to directly fix the buffering layer and the display module. Accordingly, the buffering layer 22 can effectively release the stress along the display module 21 in the bending process in order to effectively improve the change of the stress of the display module 21 when bending so as to improve the bending reliability of the display module 21.

Figure 2:
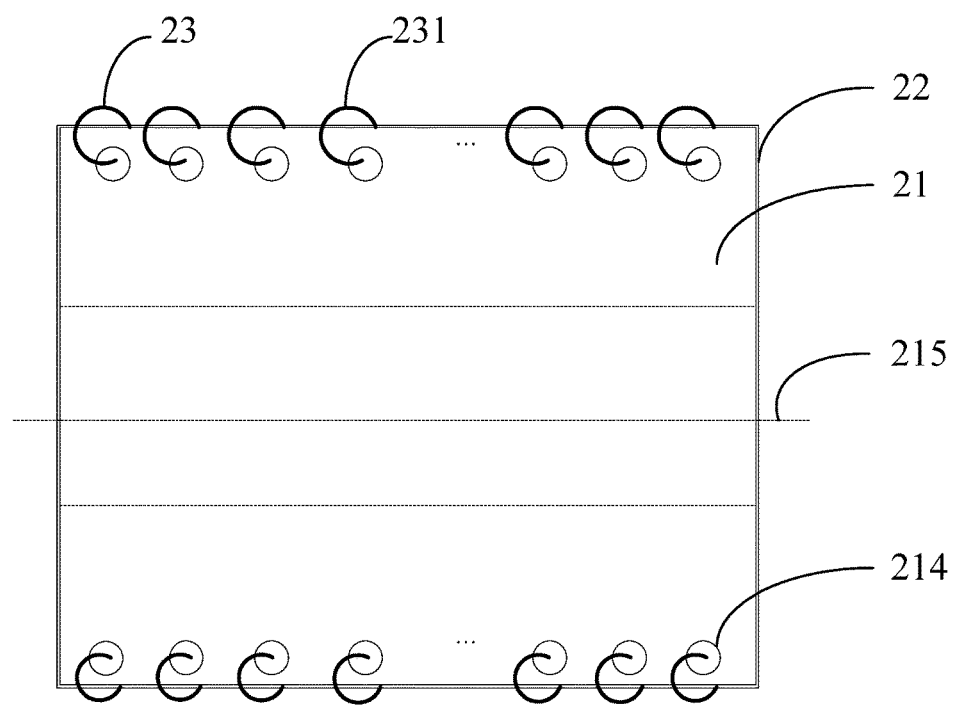
FIG. 2 is a schematic diagram of a flexible display component according to an embodiment of the present invention.

With reference to FIG. 2, optionally, the at least two fixing parts 23 are respectively located at two sides of a bending line 215 of the display module 21 under a bending status. Generally, the bending line 215 is generated when the display module 21 is bending. The at least two fixing parts 23 are respectively located at two sides of the bending line 215 and two edges of the display module 21 so as to guarantee that the fixing parts 23 will not affect the bending action of the display module 21.

Optionally, edges of the display module 21 located at two sides of the bending line 215 are provided with multiple fixing parts 23 arranged column by column. That is, each side edge is provided with multiple fixing parts 23 such as 2-30 fixing parts, 5-20 fixing parts or 8-15 fixing parts. In the present embodiment, the edges of the display module 21 located at two sides of the bending line 215 is in parallel with the bending line 215 or approximately in parallel with the bending line 215, or the edge and the bending line form an acute angle. Of course, the edges of the display module 21 located at two sides of the bending line 215 are provided with at least two fixing parts 23. Generally, the edges of the display module 21 located at two sides of the bending line 215 and the edges of the display module 21 located at two terminals of the bending line 215 forms an outer frame of the display module 21. For example, if the display module 21 is rectangular, the edges of the display module 21 located at two sides of the bending line 215 and the edges of the display module 21 located at two terminals of the bending line 215 are connected in order to form the rectangular outer frame. Besides, the fixing parts 23 are disposed at edges of the display module 21, which can greatly decrease the affection to the display function of the display module 21 in order to guarantee a normal display of the display module 21.

Furthermore, the display module 21 is divided into a bending region 216 and a non-bending region 217. The bending line 215 is located in the bending region 216. When the edges of the display module 21 located at two sides of the bending line 215 are respectively provided with at least two fixing parts 23, the fixing parts 23 are located in the non-bending region 217 such that the fixing parts 23 will not affect the bending activity of the bending region 216.

Figure 5:
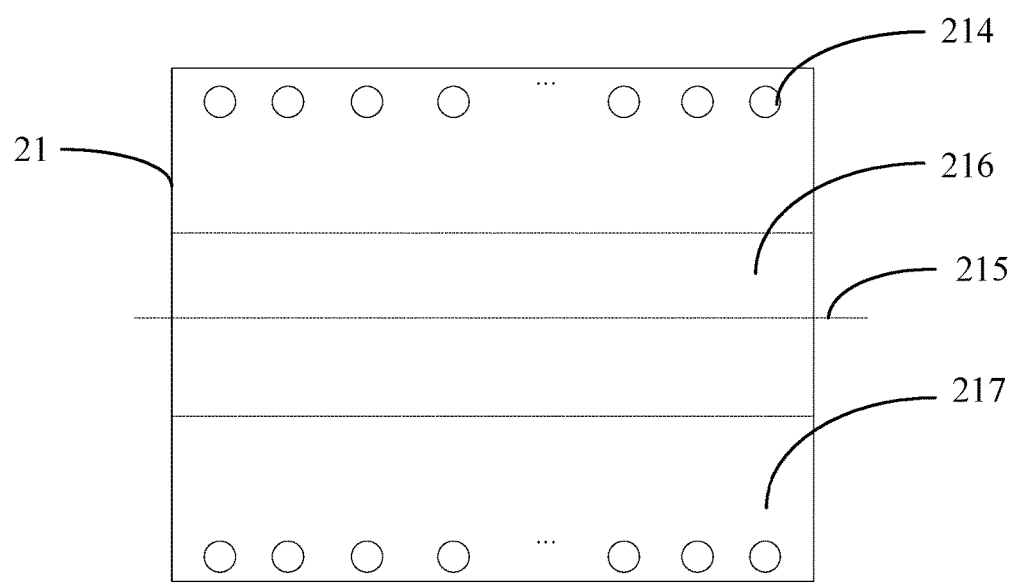
FIG. 5 is a schematic diagram of a display module according to an embodiment of the present invention.
Figure 6:
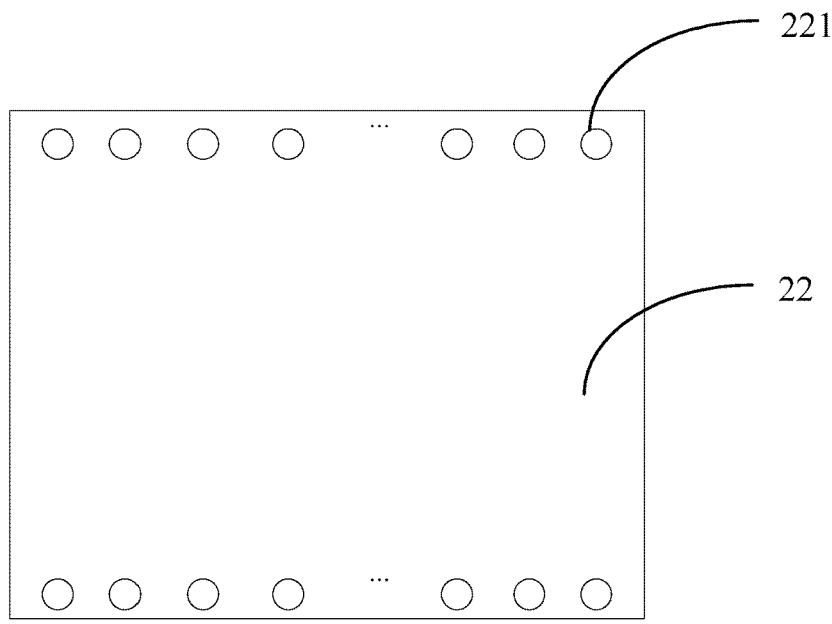
FIG. 6 is a schematic diagram of a buffering layer according to an embodiment of the present invention.

With reference to FIG. 5 and FIG. 6, the edges of the display module 21 located at two sides of the bending line 215 are respectively provided with at least one first hole 214. That is, two edges of the display module 21 are respectively provided with multiple first holes 214 arranged column by column. The buffering layer 22 is correspondingly provided with multiple second holes 221. The fixing part 23 passes through the first hole 214 and the second hole 221 in order to fix the buffering layer 22 at a side of the display module 21. Through the cooperation of the fixing part 23 and the holes, the fixing method is movable in order to change the fixing method that directly adhering through glue. Accordingly, the present invention is beneficial for improving the change of the stress of the display module 21. Of course, the number of the first holes 214 is not required to be multiple, a slot that penetrates two sides of the display module 21 and extended along and in parallel with the edge of the display module 21 can be provided in order to form the slot which is strip-shaped (not shown). The buffering layer 22 is correspondingly provided with another slot. Accordingly, a fixing part 23 that is adapted to the slot is required such as a square tube, a curved tube and a round tube so that through a cooperation of the tube wall and the slot, the buffering layer 22 and the display module 21 are fixed.

Figure 3:
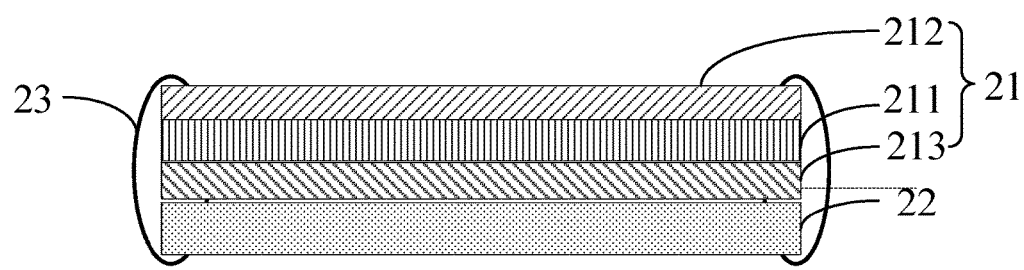
FIG. 3 is a schematic cross-sectional view of a flexible display component according to an embodiment of the present invention.

With reference to FIG. 3, FIG. 5 and FIG. 6, optionally, the fixing parts 23 can be a fixing ring 231. The fixing ring 231 penetrates through the first hole 214 and a second hole 221 in order to fix the buffering layer 22 to a side of the display module 21. In the present embodiment, the fixing ring 231 is made of metal, or an organic material such as a plastic material, or an inorganic material, or glass. However, the materials are not limited such as a mixed material or other material. The fixing ring 231 can have a notch, a ring arm passes through the first hole 214 and the second hole 221, and then, pressing together to fix the buffering layer 22. The first hole 214 and the second hole 221 can also be formed integrally. The fixing ring 231 can be a square ring, a curved ring or a round ring, and the shape can be closed or having an opening.

Figure 4:
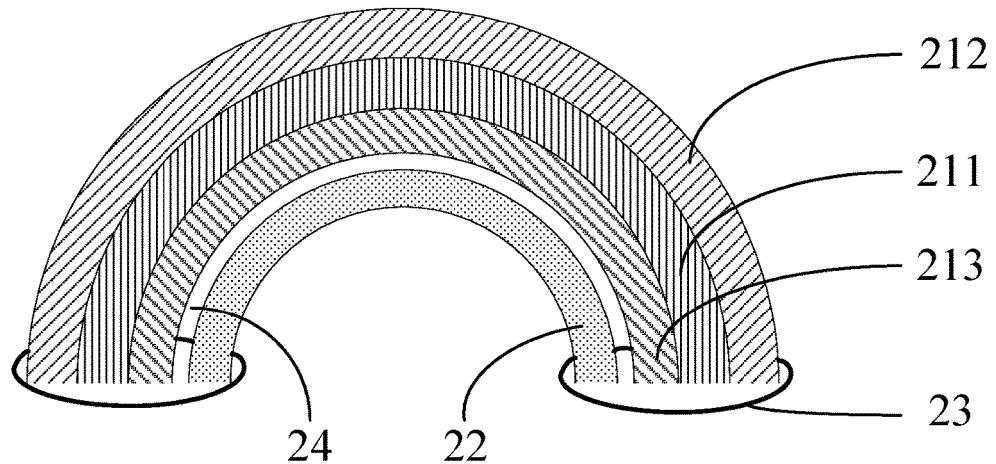
FIG. 4 is a schematic cross-sectional view of a display module under a bending status according to an embodiment of the present invention.

With reference to FIG. 3 and FIG. 4, optionally, a diameter of the fixing ring 231 is greater than a sum of a thickness of the display module 21 and a thickness of the buffering layer 22. In the present embodiment, when the display module 21 is under a bending status, the diameter of the fixing ring 231 is slightly greater than a sum of the thickness of the display module 21 and the thickness of the buffering layer 22. Between opposite surfaces of the display module 21 and the buffering layer 22, a gap is existed. Therefore, the surface stress generated by bending the buffering layer 22 will not be transmitted to the display module 21 such that the location of the original neutral plane of the display module 21 will not be affected.

In another embodiment, the first hole 214 and the second hole 221 are deposed in a stagger way. The fixing ring 231 is spiral, and the fixing ring is helically passed through the first hole 214 and the corresponding second hole 221. Accordingly, only a spiral fixing ring 231 is required at each edge.

Furthermore, a diameter of a ring arm of the fixing ring 231 is less than a diameter of the first hole 214 and the second hole 221 such that when the foam layer is bent, the stress can be released greatly in order to relieve the stress change of the display module 21. Of course, the diameter of the ring arm of the fixing ring 231 can be only less than the diameter of the second hole 221, and the diameter of the ring arm is equal to the diameter of the first hole 214.

Figure 7:
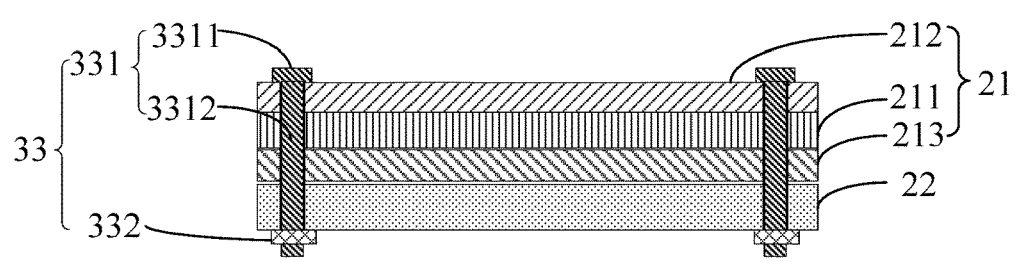
FIG. 7 is a schematic cross-sectional view of a flexible display component according to a second embodiment of the present invention.
Figure 8:
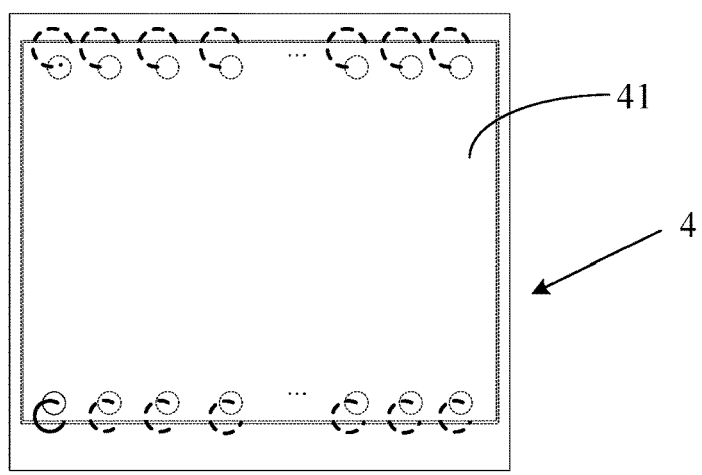
FIG. 8 is a schematic cross-sectional view of a display screen according to an embodiment of the present invention.

With reference to FIG. 5, FIG. 6 and FIG. 7, which is a second embodiment of the flexible display module of the present invention, and is similar to the first embodiment of the flexible display module of the present invention? The main difference is that a fixing part 33 includes a fixing rod 331 and a fixing cover 332. A terminal of the fixing rod 331 has a flange 3311. That is, the fixing rod 33 includes a rod body 3312 and the flange 3311 disposed at a terminal of the rod body 3312. The flange 3311 is used for limiting a movement of the fixing rod 331 such as fixing to a surface of the display module 21.

The other terminal of the fixing rod 331 sequentially passes through the first hole 214 and the second hole 221. The fixing cover 332 is disposed at the other terminal of the fixing rod 331 in order to fix the buffering layer 22 at a side of the display module. For example, when the fixing rod 331 is a screw bolt, the fixing cover 332 is a screw nut. When the fixing rod 331 passed through the first hole 214 and the second hole 221, the fixing rod 331 and the fixing cover 332 are rotated and engaged, and a gap can be reserved without tightly pressing and fixing the buffering layer 22 to the display module 21. For example, when the fixing cover 332 is disposed at the fixing rod 331, the fixing cover 332 and the fixing rod 331 are closely fitted in order to reach the purpose of fixing the buffering layer 22 and the display module 21. For example, the fixing cover 332 is provided with a protrusion (not shown), and the fixing rod 331 is provided with a recess, through a cooperation of the protrusion and the recess, a relative position of the fixing cover 332 and the fixing rod 331 can be changed in order to adjust a gap between the fixing cover 332 and the fixing rod 331.

Optionally, a distance between the flange 3311 of the fixing rod 331 to the fixing cover 332 is greater than a sum of a thickness of the display module 21 and the buffering layer 22. That is, a distance between an edge of the flange 3311 close to the buffering layer 22 and an edge of the fixing cover 332 close to the flange 3311 is greater than a sum of a thickness of the display module 21 and a thickness of the buffering layer 22.

Furthermore, a diameter of the fixing rod 331 is less than a diameter of the second hole 221, or less than a diameter of the first hole 214 and a diameter of the second hole 221 at the same time.

The embodiment of the flexible display screen of the present invention includes a component of the embodiment of the flexible display component described above. That is, a display screen 4 includes a flexible display component 41, the structure of the flexible display component can refer to the embodiment of the flexible display component, no more repeating.

In summary, in the embodiment of the present invention, through disposing the fixing part 23, when the display module 21 is under a natural status, the buffering layer 22 is contacted with a side of the display module 21. When the display module 21 is under a bending status, a gap layer 24 is existed between the buffering layer 22 and the display module 21. Different from the conventional technology that adopting an adhesive material to directly fix the buffering layer 22 and the display module 21, the buffering layer 22 can effectively release the stress in the bending process of the display module 21. The change of the generated stress will not direct transmit to the display module 21, which reduces the stress acted on the display module 21 in order to protect the display module 21 from being damaged so as to improve the bending reliability of the display module 21.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A flexible display component, comprising:
a display module;
a buffering layer; and
at least two fixing parts disposed at the display module for fixing the buffering layer to be movably fixed to a side of the display module, wherein, both the display module and the buffering layer are flexible; when the display module is under a natural status, the buffering layer is contacted with the display module, when the display module is under a bending status, both the display module and the buffering layer are bent, a gap layer is existed between the buffering layer and the display module.

2. The flexible display component according to claim 1, wherein, the at least two fixing parts are respectively located at two sides of a bending line of the display module under the bending status.

3. The flexible display component according to claim 2, wherein, edges of the display module located at two sides of the bending line are provided with multiple fixing parts arranged column by column.

4. The flexible display component according to claim 3, wherein, edges of the display module located at two sides of the bending line are respectively provided with multiple first holes arranged column by column, and the buffering layer are correspondingly provided with multiple second holes, the fixing parts respectively pass through the first holes and the second holes in order to fix the buffering layer to the side of the display module.

5. The flexible display component according to claim 4, wherein, each of the fixing parts is a fixing ring, and the fixing ring passes through the first hole and the second hole in order to fix the buffering layer to the side of the display module.

6. The flexible display component according to claim 5, wherein, a diameter of the fixing ring is greater than a sum of a thickness of the display module and a thickness of the buffering layer.

7. The flexible display component according to claim 4, wherein, the fixing part includes a fixing rod and a fixing cover, one end of the fixing rod is provided with a flange, the other end of the fixing rod sequentially passes through the first hole and the second hole, the flange is fixed at another side of the display module, the fixing cover is disposed at the other end of the fixing rod in order to fix the buffering layer to the side of the display module.

8. The flexible display component according to claim 7, wherein, a distance between the flange of the fixing rod and the fixing cover is greater than a sum of a thickness of the display module and a thickness of the buffering layer.

9. The flexible display component according to claim 1, wherein, the buffering layer is a foam layer.

10. A display screen, comprising the component as claimed in claim 1.

11. The flexible display component according to claim 1, wherein, the display module includes at least one inorganic layer and at least two organic layers, and the inorganic layer is clamped between the organic layers.

12. The flexible display component according to claim 1, wherein, the flexible display component does not adopt bonding material to fix the display module and the buffering layer.

13. The flexible display component according to claim 1, wherein, the display module is divided into a bending region and a non-bending region, and the fixing parts are located in the non-bending region such that the fixing parts do not affect the bending activity of the bending region.

14. The flexible display component according to claim 5, wherein, the first hole and the second hole are deposed in a stagger way, the fixing ring is spiral, and the fixing ring is helically passed through the first hole and the corresponding second hole.

15. The flexible display component according to claim 7, wherein, the fixing cover is provided with a protrusion, and the fixing rod is provided with a recess; a relative position of the fixing cover and the fixing rod is changed by a cooperation of the protrusion and the recess so as to adjust a gap between the fixing cover and the fixing rod.

\* \* \* \* \*